US012679761B2

(12) United States Patent
Peng et al.

(10) Patent No.: US 12,679,761 B2
(45) Date of Patent: Jul. 14, 2026

(54) ALKALI-FREE ALUMINOBOROSILICATE GLASS

(71) Applicants: CNBM RESEARCH INSTITUTE FOR ADVANCED GLASS MATERIALS GROUP CO., LTD., Bengbu (CN); Bengbu China Optoelectronic Technology Co., Ltd, Bengbu (CN)

(72) Inventors: Shou Peng, Bengbu (CN); Chong Zhang, Bengbu (CN); Yuguo Shen, Bengbu (CN); Zhiqiang Cao, Bengbu (CN); Liangmao Jin, Bengbu (CN); Mingliu Zhu, Bengbu (CN)

(73) Assignees: CNBM RESEARCH INSTITUTE FOR ADVANCED GLASS MATERIALS GROUP CO., LTD., Bengbu (CN); Bengbu China Optoelectronic Technology Co., Ltd., Bengbu (CN)

( * ) Notice: Subject to any disclaimer, the term of this patent is extended or adjusted under 35 U.S.C. 154(b) by 1036 days.

(21) Appl. No.: 17/773,527

(22) PCT Filed: Apr. 23, 2021

(86) PCT No.: PCT/CN2021/089349
§ 371 (c)(1),
(2) Date: Apr. 29, 2022

(87) PCT Pub. No.: WO2021/244180
PCT Pub. Date: Dec. 9, 2021

(65) Prior Publication Data
US 2022/0380247 A1    Dec. 1, 2022

(30) Foreign Application Priority Data

Jun. 5, 2020    (CN) ......................... 202010506283.2

(51) Int. Cl.
*C03C 3/097*    (2006.01)
*C03B 18/02*    (2006.01)
*C03C 3/093*    (2006.01)
*H10D 86/40*    (2025.01)
*H10D 86/60*    (2025.01)

(52) U.S. Cl.
CPC .............. *C03C 3/097* (2013.01); *C03B 18/02* (2013.01); *C03C 3/093* (2013.01); *H10D 86/411* (2025.01); *H10D 86/60* (2025.01)

(58) Field of Classification Search
None
See application file for complete search history.

(56) References Cited

U.S. PATENT DOCUMENTS

| | | | | |
|---|---|---|---|---|
| 5,785,726 A | * | 7/1998 | Dorfeld ................... | C03C 3/091 |
| | | | | 65/157 |
| 6,417,124 B1 | * | 7/2002 | Peuchert ................ | C03C 3/093 |
| | | | | 313/493 |
| 6,465,381 B1 | * | 10/2002 | Lautenschlager ....... | C03C 3/091 |
| | | | | 501/59 |
| 2002/0151426 A1 | * | 10/2002 | Murata ................... | C03C 3/093 |
| | | | | 501/63 |

FOREIGN PATENT DOCUMENTS

| | | | | |
|---|---|---|---|---|
| CN | 1284481 A | 2/2001 | | |
| CN | 1285325 A | 2/2001 | | |
| CN | 102001825 A | 4/2011 | | |
| CN | 108467197 A | 8/2018 | | |
| CN | 108503214 A | 9/2018 | | |
| CN | 109052936 A | 12/2018 | | |
| CN | 109678341 A | * 4/2019 | ............. | C03C 3/091 |
| CN | 110330226 A | 10/2019 | | |
| CN | 110436774 A | 11/2019 | | |
| CN | 111217521 A | 6/2020 | | |
| CN | 111606560 A | 9/2020 | | |
| JP | 2002-029776 A | 1/2002 | | |
| JP | 2002-308643 A | 10/2002 | | |
| JP | 2003-192377 A | 7/2003 | | |
| JP | 2003-335548 A | 11/2003 | | |
| JP | 2013-216562 A | 10/2013 | | |
| JP | 2015-024959 A | 2/2015 | | |
| JP | 2016-222510 A | 12/2016 | | |
| JP | 2018-100217 A | 6/2018 | | |
| KR | 20010069996 A | 7/2001 | | |
| WO | WO2019208584 A1 | 10/2019 | | |

OTHER PUBLICATIONS

Machine Translation of CN-109678341-A ("Zhang") (Year: 2019).*

* cited by examiner

*Primary Examiner* — Amber R Orlando
*Assistant Examiner* — Paul Alan Forsyth
(74) *Attorney, Agent, or Firm* — Bret E. Field; Bozicevic, Field & Francis LLP

(57) ABSTRACT

Provided is alkali-free aluminoborosilicate glass. The glass is prepared by the following raw materials in percentage by weight: 60-72% $SiO_2$, 13-18% of $Al_2O_3$, 8.5-10% of $B_2O_3$, 1-4.5% of MgO, 3-8% of CaO, 1-5% of SrO, 0.5-2% of $ZrO_2$, 1-5% of $P_2O_5$, and 0.1-0.5% of $SnO_2$, wherein $SiO_2$+ $Al_2O_3$ is 76-85%; (MgO+CaO+SrO)/$Al_2O_3$ is 0.4-0.7; the total amount of alkaline earth metal oxide is 5-11.5%; $B_2O_3$/($B_2O_3$+$ZrO_2$+$P_2O_5$) is 0.6-0.9; and ($ZrO_2$+$P_2O_5$)/ (MgO+CaO+SrO) is 0.15-0.8. The glass has the characteristics such as higher strain point, high Young modulus, high hardness, high specific modulus, proper thermal expansion coefficient, and low thermal shrinkage; the boron volatilization rate is as low as 5.6-10.5%, so that the phenomenon of component nonuniformity due to boron volatilization can be effectively controlled; and the glass is suitable for a float forming process, does not contain toxic substances such as $As_2O_3$ and $Sb_2O_3$, is environment-friendly, is suitable for large-scale industrial production, and is particularly suitable for glass substrates for LCD/OLED displays.

6 Claims, No Drawings

ALKALI-FREE ALUMINOBOROSILICATE GLASS

The present application claims the priority of the Chinese Patent Application No. 202010506283.2, with the title of "ALKALI-FREE ALUMINOBOROSILICATE GLASS", filed on Jun. 5, 2020 before the China National Intellectual Property Administration, which is hereby incorporated by reference in its entirety.

FIELD OF THE INVENTION

The present invention belongs to the field of glass production, and relates to various glass substrates for displays, in particular to an alkali-free aluminoborosilicate glass.

BACKGROUND OF THE INVENTION

With the development of optoelectronic display technology and the popularization of electronic products, liquid crystal displays constantly develop, and the requirements for display performance constantly increase. Slimming, high-resolution, and ultra-high-definition are gradually occupying the display market and become mainstream features. Therefore, the glass substrate technology for displays is also being continuously innovated, and the requirements for the glass substrate performance are becoming more and more demanding. In the panel manufacturing process for flat panel display, it is necessary to plate metal or its oxide film on the surface of the glass substrate, and the alkali metal ions in the substrate glass diffuse into the film, damaging the performance of the film. Therefore, the glass should not contain alkali metal oxides. As the image resolution of the display becomes higher and higher, the deformation of the glass substrate is required to be lower and lower and the thermal shrinkage rate of the glass substrate needs to be strictly controlled during the panel printing and film plating heat treatments.

Regarding amorphous silicon (a-Si) TFT technology, the processing temperature in the production process is 300-450° C. Low-temperature polysilicon TFT technology requires a higher heat treatment temperature during the panel manufacturing process. The glass substrate cannot deform during multiple high-temperature treatments. Generally, the strain point of the glass substrate is required to be higher than 650° C., and its thermal shrinkage rate should be as small as possible; at the same time, the expansion coefficient of the glass substrate needs to be close to that of silicon, so the linear thermal expansion coefficient of the glass substrate should be less than $38\times^{-7}/°$ C. Therefore, alkali-free aluminoborosilicate glass is required to have the following characteristics: low density, high strain point, suitable thermal expansion coefficient (less than $38\times^{-7}/°$ C.), high Young's modulus, chemical resistance, low thermal shrinkage, no internal and surface defects (bubbles, ribs, inclusions, etc.).

For the borosilicate glass system, boron is an important part of the glass, which affects the preparation and melting of the glass and the physical and chemical properties of the substrate, and it also has a fluxing effect. The introduction of boron in TFT glass is based on boric anhydride, boric acid and boric anhydride/boric acid. However, no matter which way boron is introduced, there will be boron volatilization phenomena (up to 15%) during the glass melting process, which will cause the composition of the substrate glass to be different from the original set value, destroy the uniformity of the glass, and even cause environmental pollution, increase the consumption of raw materials, erode the furnace, shorten the lifetime of the furnace, and increase the operating cost of the production line.

SUMMARY OF THE INVENTION

The object of the present invention is to solve the problems of large boron volatilization, serious furnace corrosion, and poor product glass uniformity in the existing borosilicate glass system during the smelting process, and to provide an alkali-free aluminoborosilicate glass. In order to achieve the above objects, the technical solutions of the present invention are as follows:

an alkali-free aluminoborosilicate glass, which is made from raw materials in following weight percentage: 60-72% of $SiO_2$, 13-18% of $Al_2O_3$, 8.5-10% of $B_2O_3$, 1-4.5% of $MgO$, 3-8% of $CaO$, 1-5% of $SrO$, 0.5-2% of $ZrO_2$, 1-5% of $P_2O_5$, and 0.1-0.5% of $SnO_2$, and a total weight percentage of the raw materials is 100%;

wherein $SiO_2+Al_2O_3$ is 76-85%;

$(MgO+CaO+SrO)/Al_2O_3$ is 0.4-0.7;

a total amount of alkaline earth metal oxides is 5-11.5%;

$B_2O_3/(B_2O_3+ZrO_2+P_2O_5)$ is 0.6-0.9; and $(ZrO_2+P_2O_5)/(MgO+CaO+SrO)$ is 0.15-0.8.

further, an alkali-free aluminoborosilicate glass, which is made from raw materials in following weight percentage: 61.8-70.5% of $SiO_2$, 13-17.5% of $Al_2O_3$, 8.5-10% of $B_2O_3$, 1-4.02% of $MgO$, 3.05-6.2% of $CaO$, 1.05-4.4% of $SrO$, 0.5-1.96% of $ZrO_2$, 1-4.93% of $P_2O_5$, and 0.1-0.5% of $SnO_2$;

wherein $SiO_2+Al_2O_3$ is 77.4-83.5%;

$(MgO+CaO+SrO)/Al_2O_3$ is 0.42-0.65;

a total amount of alkaline earth metal oxides is 5.45-10.3%;

$B_2O_3/(B_2O_3+ZrO_2+P_2O_5)$ is 0.62-0.83; and $(ZrO_2+P_2O_5)/(MgO+CaO+SrO)$ is 0.15-0.7.

further, the alkali-free aluminoborosilicate glass, wherein the glass has a $\beta$-OH value of less than 0.5%, a boron volatilization rate of less than 11%, a thermal expansion coefficient less than $39.5\times10^{-7}/°$ C. in the range of 50-350° C., a Young's modulus of higher than 78 GPa, a strain point of higher than 690° C., a melting temperature of lower than 1662° C., and a thermal shrinkage rate of lower than 11.5 ppm.

further, the alkali-free aluminoborosilicate glass, wherein the glass has 0.11-0.47% of a $\beta$-OH value, 5.67-10.37% of a boron volatilization rate, $33.70-39.5\times10^{-7}/°$ C. of a thermal expansion coefficientin the range of 50-350° C., 78.2-84.1 GPa of a Young's modulus, 690-739° C. of a strain point, a melting temperature lower than 1662° C., and 7.68-11.45 ppm of a thermal shrinkage rate.

In the glass composition of the present invention:

the $SiO_2$ in the glass composition is a glass forming body and constitutes a component of the glass skeleton. Increasing the content of $SiO_2$ will improve chemical resistance, mechanical strength, and strain point. If the content of $SiO_2$ is too high, the high-temperature viscosity of the glass will increase, causing refractory and aggravating corrosion of refractory materials. If the content of $SiO_2$ is low, it is not easy to form glass, the strain point will decrease, the expansion coefficient will increase, and the acid resistance and alkali resistance will decrease. Considering melting temperature, glass expansion coefficient, mechanical strength, hardening rate of glass with temperature and other properties, the present invention uses 60-72 wt % of $SiO_2$.

$Al_2O_3$ in the glass composition is an intermediate oxide, which is used to increase the strength and strain point of the glass structure, improve the chemical stability of the glass, and reduce the tendency of glass to crystallize. If the content of $Al_2O_3$ is too high, the glass is difficult to smelt, has fast hardening rate of glass with temperature, and is easy to crystallize. If the content of $Al_2O_3$ is low, the glass is easy to be devitrified, has low mechanical strength, and is not easy to mold. The present invention uses 13-18 wt % of $Al_2O_3$.

$B_2O_3$ in the glass composition can form glass alone, which is a good fluxing agent, reducing glass viscosity, dielectric loss and vibration loss, and improving glass brittleness, toughness and light transmittance. There are two structures of $[BO_4]$ tetrahedron and $[BO_3]$ triangle in glass. $B_2O_3$ is difficult to form $[BO_4]$ under high temperature melting conditions, which can reduce high temperature viscosity. At low temperatures, B has a tendency to deprive free oxygen to form $[BO_4]$, which makes the structure more compact, increases the low-temperature viscosity of the glass, and prevents the occurrence of crystallization. The present invention uses 8.5-10 wt % of $B_2O_3$.

In the glass composition, MgO has the effect of reducing high temperature viscosity and increasing low-temperature viscosity, it also can increase the Young's modulus and specific modulus of glass, and inhibit the increase of glass brittleness. The present invention uses 1-4.5 wt % of MgO.

The alkaline earth metal oxide RO (CaO, SrO, BaO) in the glass composition can increase the glass strain point and Young's modulus, reduce the thermal expansion coefficient, and effectively reduce high-temperature viscosity of the glass, thereby improving the glass's meltability and formability. If the content of alkaline earth metal oxide RO is too high, it will increase the probability of devitrification and phase splitting in glass. The present invention uses 5-11.5 wt % of RO.

The introduction of $ZrO_2$ into the glass composition promotes glass melting, improves the Young's modulus and fracture strength of the glass, reduces the high-temperature resistivity of the glass, and promotes the stability of the glass. If the content of $ZrO_2$ is too high, the density and thermal expansion coefficient of the glass will increase. The present invention uses 0.5-2 wt % of $ZrO_2$.

The introduction of $P_2O_5$ into the glass composition improves the strain point and devitrification resistance of the glass. The present invention uses 1-5 wt % of $P_2O_5$.

The glass composition limits $B_2O_3/(B_2O_3+ZrO_2+P_2O_5)$ to be 0.62-0.83; $(ZrO_2+P_2O_5)/(MgO+CaO+SrO)$ to be 0.15-0.7 to inhibit boron volatilization, and by controlling the β-OH value between 0.1-0.5, the glass meltability is improved, which is beneficial to industrial production.

When using the glass composition of the present invention to prepare aluminoborosilicate glass, it can make the glass have excellent comprehensive properties, mainly due to the mutual coordination between the components in the composition, particularly the coordination between $SiO_2$, $Al_2O_3$, $B_2O_3$, MgO, CaO, SrO, $ZrO_2$, and $P_2O_5$, more particularly the mutual coordination between the aforementioned specific content of the components.

The advantageous effects of the present invention are as follows.

(1) The glass of the present invention has the characteristics of high strain point, high Young's modulus, high hardness, high specific modulus, suitable thermal expansion coefficient, low thermal shrinkage, etc., in particular, the boron volatilization rate is reduced to 5.6-10.5%, and the inhomogeneity of composition caused by boron volatilization is effectively controlled.

(2) The boron element in the glass is a volatile light element. On the one hand, the volatilization of the boron element brings about the inhomogeneity of the glass composition, resulting in banded stripes on the glass substrate, and crystallization in severe cases. The reduction of boron volatilization rate improves the yield and product quality in the subsequent manufacturing process of the substrate. On the other hand, boron volatilization in the glass production process brings great harm to the furnace process operation. The volatilized boron element is easy to condense again when it colds, and it will condense on burner nozzle and block the burner nozzle, which will easily result in the change of the combustion status of the furnace. In severe cases, the entire furnace process cannot operate normally, and the resistance for discharging smoke increases due to condensation on the exhaust pipe The combustion pressure of the furnace increases and the gas combustion is insufficient. The reduction of the boron volatilization rate ensures the stable operation of the process, the furnace temperature continues to maintain the control index and the normal production.

(3) The glass of the present invention is suitable for float forming process and does not contain toxic substances such as $As_2O_3$ and $Sb_2O_3$. It is an environmentally friendly formula and conforms to the development trend of the flat panel display industry. It is suitable for large-scale industrial production; especially suitable for LCD/OLED display glass substrate.

DETAILED DESCRIPTION OF THE INVENTION

In order to make the objects, technical solutions, and advantages of the present invention more clear, the present invention will be described in detail with reference to following examples. Obviously, the described examples are only a part of the examples of the present invention, rather than all of the examples. All other examples obtained by those skilled in the art based on the examples in the present application will fall within the protection scope of the application.

The present invention provides a method for preparing an alkali-free aluminoborosilicate glass, using the formula described in Table 1-5, wherein $SiO_2$, $Al_2O_3$, $B_2O_3$, MgO, CaO, SrO, $ZrO_2$, and $P_2O_5$ mean that the composition contains Si-containing compounds, Al-containing compounds, B-containing compounds, Mg-containing compounds, Ca-containing compounds, Sr-containing compounds, Zr-containing compounds, and P-containing compounds, such as carbonate, nitrate, sulfate, oxide, etc. of the aforementioned elements. The content of each component is measured in the oxide of each element. According to different glass preparation processes, the composition contains a clarifying agent. There is no particular limitation on the specific choice of clarifying agent, and various clarifying agents commonly used in the field can be selected. Under heating conditions, the $SiO_2$, $Al_2O_3$, $B_2O_3$, MgO, CaO, SrO, $ZrO_2$ and $P_2O_5$ are evenly mixed and then subjected to high-temperature melting (1450-1650° C.), clarification and homogenization, molding, and annealing (higher than 600° C.) to obtain an alkali-free aluminoborosilicate glass substrate, which is then such as cutted, grinded, and polished.

The glass does not substantially contain alkali metal oxides and does not substantially contain BaO.

The clarifying agent may be any one of calcium sulfate, strontium nitrate, and calcium chloride, or may be a composite clarifying agent, such as containing at least one of sulfate, nitrate, and chloride.

Those skilled in the art should understand that the method of controlling the β-OH value of the present invention includes: selecting raw materials with low water content; adding components that reduce the water content in the glass (such as adding sulfates, chlorides, etc.); reducing the water content in the furnace environment; bubbling with nitrogen in the molten glass; adopting a small furnace; accelerating the flow of the molten glass; and using an electric melting method. These methods are well known to those skilled in the art, and will not be detailed here.

In an embodiment of the present invention, the alkali-free aluminoborosilicate glass of the present application can be prepared by the following steps:

(1) weighing the batch materials and mixing them thoroughly;

(2) smelting the mixed glass batch materials at 1450-1650° C. for 7-12 h, and then clarifying at 1600-1700° C. for 60-120 minutes; and (3) slip casting, annealing at 600-750° C. for 5-10 h.

Preferably, the glass composition of the present invention has 0.11-0.47% of a β-OH value, 5.67-10.37% of a boron volatilization rate, $33.70\text{-}39.5 \times 10^{-7}/°$ C. of a thermal expansion coefficient in the range of 50-350° C., 690-739° C. of a strain point, a melting temperature lower than 1662° C., and 7.68-11.45 ppm of a thermal shrinkage rate.

The present invention provides the use of the glass composition of the present invention as an alkali-free aluminosilicate glass in the preparation of display devices and/or optoelectronic devices, preferably in the preparation of TFT-LCD glass substrates and/or OLED glass substrates.

In the following examples and comparative examples: the alkali-free aluminoborosilicate glass is prepared by the following steps:

(1) weighing the batch materials according to the proportions in Table 1 to Table 5, and mixing them thoroughly;

(2) smelting the mixed glass batch at 1500° C. for 10 h, and then clarifying at 1650° C. for 90 minutes;

(3) slip casting, annealing at 650° C. for 10 h; and (4) processing and subjecting to performance tests.

The performance tests include:

analyzing and calculating the hydroxyl content in the glass by using Fourier transform infrared spectrometer, in %;

obtaining the boron volatilization rate by comparing the boron content with the amount of boron in the glass raw material, in %;

measuring the thermal expansion coefficient of glass at 50-350° C. with a horizontal dilatometer according to ASTME-228, in $10^{-7}/°$ C.;

determining the Vickers hardness (HV) with an automatic turret digital micro Vickers hardness tester according to GB/T4340.2-2012;

measure the Young's modulus of glass with a material mechanics testing machine according to ASTM C-623, in GPa; calculating and obtaining the specific modulus from the ratio of Young's modulus and density, in $GPa/(g \times cm^{-3})$;

measuring the annealing point and strain point of the glass using a three-point tester according to ASTMC-336 and ASTMC-338, in ° C.;

measuring the high-temperature viscosity-temperature curve of glass with a rotary high-temperature viscometer according to ASTMC-965, where the corresponding temperature at 200 P viscosity is the melting temperature, and the unit is ° C.; and obtaining the thermal shrinkage with the difference calculation method. The method comprise: a glass substrate without any defects is used and the initial length is marked as L0, after a certain condition of heat treatment (for example, the heat treatment process conditions of the present invention are: heating the glass from room temperature to 600° C. at a heating rate of 10° C./min and holding it for 10 minutes, and then lowering the temperature to the room temperature at a cooling rate of 10° C./min), the length of the substrate shrinks by a certain amount, and the length is measured again, marked as Lt, and the thermal shrinkage Yt is expressed as:

$$Yt = \frac{L0 - Lt}{L0} \times 100\%.$$

Specific examples and comparative examples are given below, in which each component in the formula is measured by weight percentage, see Tables 1, 2, 3, 4, and 5:

TABLE 1

| Component wt % | Example 1 | Example 2 | Example 3 | Example 4 | Example 5 | Example 6 | Example 7 | Example 8 |
|---|---|---|---|---|---|---|---|---|
| $SiO_2$ | 60.15 | 60.26 | 60.39 | 60.53 | 61.45 | 61.57 | 61.64 | 61.89 |
| $Al_2O_3$ | 17.59 | 16.50 | 17.01 | 16.42 | 16.56 | 16.22 | 18.00 | 16.44 |
| $B_2O_3$ | 8.94 | 9.81 | 9.92 | 8.53 | 8.81 | 9.13 | 8.50 | 8.73 |
| MgO | 1.86 | 2.53 | 1.26 | 2.57 | 2.78 | 2.04 | 2.48 | 3.47 |
| CaO | 4.11 | 3.38 | 6.43 | 5.56 | 6.19 | 5.35 | 3.56 | 3.25 |
| SrO | 1.42 | 1.53 | 2.37 | 3.08 | 1.19 | 2.30 | 2.32 | 4.32 |
| $ZrO_2$ | 0.50 | 0.80 | 1.00 | 1.71 | 0.71 | 1.51 | 1.36 | 0.79 |
| $P_2O_5$ | 4.93 | 4.89 | 1.12 | 1.10 | 2.20 | 1.75 | 1.99 | 1.01 |
| $SnO_2$ | 0.50 | 0.30 | 0.50 | 0.50 | 0.11 | 0.13 | 0.15 | 0.10 |
| $SiO_2 + Al_2O_3$ | 77.74 | 76.76 | 77.40 | 76.95 | 78.01 | 77.79 | 79.64 | 78.33 |
| $(MgO + CaO + SrO)/Al_2O_3$ | 0.42 | 0.45 | 0.59 | 0.68 | 0.61 | 0.60 | 0.46 | 0.67 |
| Total amount of alkaline earth metals | 7.39 | 7.44 | 10.06 | 11.21 | 10.16 | 9.69 | 8.36 | 11.04 |
| $B_2O_3/(B_2O_3 + ZrO_2 + P_2O_5)$ | 0.62 | 0.63 | 0.82 | 0.75 | 0.75 | 0.74 | 0.72 | 0.83 |
| $(ZrO_2 + P_2O_5)/(MgO + CaO + SrO)$ | 0.73 | 0.76 | 0.21 | 0.25 | 0.29 | 0.34 | 0.40 | 0.16 |
| β-OH | 0.36 | 0.29 | 0.19 | 0.24 | 0.3 | 0.39 | 0.38 | 0.4 |
| Volatilization rate of boron, % | 9.56 | 10.33 | 10.17 | 9.23 | 8.42 | 9.71 | 10.35 | 10.06 |
| Thermal expansion coefficient (50-350° C.), $10^{-7}/°$ C. | 39.5 | 38.1 | 38.8 | 35.9 | 36.6 | 35.7 | 39.4 | 36.8 |

TABLE 1-continued

| Component wt % | Example 1 | Example 2 | Example 3 | Example 4 | Example 5 | Example 6 | Example 7 | Example 8 |
|---|---|---|---|---|---|---|---|---|
| Young's modulus, GPa | 78.90 | 80.6 | 79.8 | 81.2 | 80.4 | 79.9 | 81.8 | 78.3 |
| Vickers hardness, Hv | 679.7 | 677.1 | 676.3 | 673.8 | 674.7 | 679.4 | 680.8 | 678.3 |
| Specific modulus, GPa/g × cm$^{-3}$ | 30.46 | 31.24 | 30.69 | 31.21 | 32.83 | 31.49 | 32.04 | 31.63 |
| Strain point, ° C. | 711.00 | 706 | 690 | 712 | 720 | 704 | 693 | 726 |
| Melting temperature, $T_{2.3}$ ° C. | 1601 | 1612 | 1606 | 1613 | 1608 | 1632 | 1613 | 1622 |
| Thermal shrinkage (600° C., 10 min), ppm | 10.84 | 11.03 | 9.05 | 10.74 | 11.37 | 7.68 | 11.29 | 10.48 |

TABLE 2

| Component wt % | Example 9 | Example 10 | Example 11 | Example 12 | Example 13 | Example 14 | Example 15 | Example 16 |
|---|---|---|---|---|---|---|---|---|
| $SiO_2$ | 62.35 | 62.51 | 62.73 | 62.80 | 63.24 | 63.73 | 63.81 | 64.17 |
| $Al_2O_3$ | 16.11 | 16.03 | 15.30 | 15.19 | 15.52 | 14.32 | 14.52 | 14.05 |
| $B_2O_3$ | 9.23 | 8.62 | 10.00 | 9.31 | 8.72 | 8.81 | 9.01 | 8.55 |
| MgO | 4.02 | 2.85 | 4.01 | 3.25 | 3.13 | 1.65 | 2.56 | 1.95 |
| CaO | 3.66 | 4.69 | 5.14 | 4.17 | 3.25 | 4.16 | 5.03 | 4.14 |
| SrO | 2.61 | 1.83 | 1.15 | 1.14 | 1.19 | 3.55 | 2.15 | 2.08 |
| $ZrO_2$ | 0.58 | 1.21 | 0.55 | 1.10 | 0.55 | 1.59 | 1.31 | 1.21 |
| $P_2O_5$ | 1.29 | 2.14 | 1.01 | 2.89 | 4.27 | 2.07 | 1.46 | 3.74 |
| $SnO_2$ | 0.15 | 0.12 | 0.11 | 0.15 | 0.13 | 0.12 | 0.15 | 0.11 |
| $SiO_2 + Al_2O_3$ | 78.46 | 78.54 | 78.03 | 77.99 | 78.76 | 78.05 | 78.33 | 78.22 |
| $(MgO + CaO + SrO)/Al_2O_3$ | 0.64 | 0.58 | 0.67 | 0.56 | 0.49 | 0.65 | 0.67 | 0.58 |
| Total amount of alkaline earth metals | 10.29 | 9.37 | 10.30 | 8.56 | 7.57 | 9.36 | 9.74 | 8.17 |
| $B_2O_3/(B_2O_3 + ZrO_2 + P_2O_5)$ | 0.83 | 0.72 | 0.87 | 0.70 | 0.64 | 0.71 | 0.76 | 0.63 |
| $(ZrO_2 + P_2O_5)/(MgO + CaO + SrO)$ | 0.18 | 0.36 | 0.15 | 0.47 | 0.64 | 0.39 | 0.28 | 0.61 |
| β-OH | 0.37 | 0.34 | 0.32 | 0.28 | 0.31 | 0.35 | 0.24 | 0.18 |
| Volatilization rate of boron, % | 9.52 | 10.37 | 9.19 | 8.62 | 7.06 | 8.87 | 9.45 | 10.23 |
| Thermal expansion coefficient (50-350° C.), 10$^{-7}$/° C. | 37.1 | 38.5 | 36.4 | 39.3 | 37.9 | 35.2 | 34.6 | 36.9 |
| Young's modulus, GPa | 80.6 | 78.2 | 79.4 | 81.7 | 79.6 | 81.2 | 79.7 | 80.3 |
| Vickers hardness, Hv | 677.4 | 673.9 | 678.5 | 668.6 | 680.3 | 679.4 | 677.1 | 676.9 |
| Specific modulus, GPa/g × cm$^{-3}$ | 30.7 | 31.34 | 32.06 | 30.65 | 31.27 | 30.25 | 30.94 | 31.83 |
| Strain point, ° C. | 706 | 694 | 725 | 718 | 724 | 708 | 713 | 725 |
| Melting temperature, $T_{2.3}$ ° C. | 1634 | 1609 | 1614 | 1621 | 1626 | 1618 | 1605 | 1622 |
| Thermal shrinkage (600° C., 10 min), ppm | 10.83 | 8.75 | 10.71 | 8.35 | 9.56 | 11.25 | 10.76 | 8.89 |

TABLE 3

| Component wt % | Example 17 | Example 18 | Example 19 | Example 20 | Example 21 | Example 22 | Example 23 | Example 24 |
|---|---|---|---|---|---|---|---|---|
| $SiO_2$ | 64.55 | 65.39 | 65.61 | 65.82 | 66.41 | 66.83 | 67.17 | 67.42 |
| $Al_2O_3$ | 14.26 | 14.61 | 14.14 | 14.09 | 13.86 | 13.29 | 13.02 | 13.15 |
| $B_2O_3$ | 8.91 | 9.15 | 8.64 | 9.26 | 8.55 | 8.75 | 9.03 | 9.59 |
| MgO | 2.08 | 1.99 | 2.15 | 1.64 | 1.95 | 2.17 | 3.05 | 1.15 |
| CaO | 3.65 | 4.17 | 3.55 | 4.86 | 4.91 | 4.05 | 4.22 | 3.64 |
| SrO | 2.87 | 2.06 | 2.18 | 1.09 | 2.37 | 1.96 | 1.25 | 1.47 |
| $ZrO_2$ | 1.96 | 1.32 | 1.35 | 0.85 | 0.75 | 1.63 | 0.79 | 1.95 |
| $P_2O_5$ | 1.60 | 1.21 | 2.23 | 2.27 | 1.05 | 1.20 | 1.36 | 1.48 |
| $SnO_2$ | 0.12 | 0.10 | 0.15 | 0.12 | 0.15 | 0.12 | 0.11 | 0.15 |
| $SiO_2 + Al_2O_3$ | 78.81 | 80.00 | 79.75 | 79.91 | 80.27 | 80.12 | 80.19 | 80.57 |
| $(MgO + CaO + SrO)/Al_2O_3$ | 0.60 | 0.56 | 0.56 | 0.54 | 0.67 | 0.62 | 0.65 | 0.48 |
| Total amount of alkaline earth metals | 8.60 | 8.22 | 7.88 | 7.59 | 9.23 | 8.18 | 8.52 | 6.26 |
| $B_2O_3/(B_2O_3 + ZrO_2 + P_2O_5)$ | 0.71 | 0.78 | 0.71 | 0.75 | 0.83 | 0.76 | 0.81 | 0.74 |
| $(ZrO_2 + P_2O_5)/(MgO + CaO + SrO)$ | 0.41 | 0.31 | 0.45 | 0.41 | 0.20 | 0.35 | 0.25 | 0.55 |
| β-OH | 0.21 | 0.26 | 0.22 | 0.17 | 0.11 | 0.2 | 0.14 | 0.16 |
| Volatilization rate of boron, % | 6.92 | 8.35 | 10.24 | 10.22 | 9.95 | 5.67 | 6.52 | 9.57 |
| Thermal expansion coefficient (50-350° C.), 10$^{-7}$/° C. | 35.6 | 34.7 | 35.1 | 36.3 | 35.7 | 34.4 | 33.7 | 35.6 |
| Young's modulus, GPa | 81.6 | 80.7 | 79.2 | 81.5 | 84.1 | 81.3 | 82.4 | 80.9 |
| Vickers hardness, Hv | 668.3 | 673.8 | 669.4 | 678.4 | 679.1 | 682.2 | 681.6 | 678.6 |
| Specific modulus, GPa/g × cm$^{-3}$ | 32.31 | 30.97 | 31.62 | 30.76 | 33.29 | 31.62 | 32.97 | 31.86 |
| Strain point, ° C. | 719 | 716 | 720 | 709 | 721 | 719 | 724 | 722 |

TABLE 3-continued

| Component wt % | Example 17 | Example 18 | Example 19 | Example 20 | Example 21 | Example 22 | Example 23 | Example 24 |
|---|---|---|---|---|---|---|---|---|
| Melting temperature, $T_{2.3}$ ° C. | 1618 | 1628 | 1632 | 1638 | 1619 | 1633 | 1621 | 1636 |
| Thermal shrinkage (600° C., 10 min), ppm | 9.42 | 10.59 | 7.83 | 8.92 | 9.21 | 10.34 | 9.11 | 11.45 |

TABLE 4

| Component wt % | Example 25 | Example 26 | Example 27 | Example 28 | Example 29 | Example 30 | Example 31 | Example 32 |
|---|---|---|---|---|---|---|---|---|
| $SiO_2$ | 67.78 | 68.14 | 68.63 | 68.85 | 69.31 | 69.79 | 70.33 | 70.71 |
| $Al_2O_3$ | 13.05 | 14.21 | 13.04 | 13.17 | 13.35 | 13.07 | 13.01 | 13.00 |
| $B_2O_3$ | 8.83 | 8.62 | 8.57 | 8.74 | 8.74 | 8.85 | 8.55 | 8.67 |
| MgO | 1.42 | 1.03 | 2.25 | 1.19 | 2.12 | 1.92 | 1.38 | 1.16 |
| CaO | 3.11 | 3.28 | 3.08 | 3.13 | 3.35 | 3.34 | 3.45 | 3.25 |
| SrO | 3.06 | 1.87 | 1.72 | 1.38 | 1.16 | 1.02 | 1.17 | 1.04 |
| $ZrO_2$ | 0.97 | 0.95 | 0.73 | 1.33 | 0.63 | 0.55 | 0.75 | 1.01 |
| $P_2O_5$ | 1.64 | 1.79 | 1.86 | 2.06 | 1.21 | 1.31 | 1.21 | 1.02 |
| $SnO_2$ | 0.14 | 0.11 | 0.12 | 0.15 | 0.13 | 0.15 | 0.15 | 0.14 |
| $SiO_2 + Al_2O_3$ | 80.83 | 82.35 | 81.67 | 82.02 | 82.66 | 82.86 | 83.34 | 83.71 |
| $(MgO + CaO + SrO)/Al_2O_3$ | 0.58 | 0.43 | 0.54 | 0.43 | 0.50 | 0.48 | 0.46 | 0.42 |
| Total amount of alkaline earth metals | 7.59 | 6.18 | 7.05 | 5.70 | 6.63 | 6.28 | 6.00 | 5.45 |
| $B_2O_3/(B_2O_3 + ZrO_2 + P_2O_5)$ | 0.77 | 0.76 | 0.77 | 0.72 | 0.83 | 0.83 | 0.81 | 0.81 |
| $(ZrO_2 + P_2O_5)/(MgO + CaO + SrO)$ | 0.34 | 0.44 | 0.37 | 0.59 | 0.28 | 0.30 | 0.33 | 0.37 |
| β-OH | 0.2 | 0.25 | 0.19 | 0.22 | 0.24 | 0.23 | 0.33 | 0.24 |
| Volatilization rate of boron, % | 8.63 | 7.39 | 10.36 | 7.18 | 10.06 | 7.25 | 9.03 | 10.24 |
| Thermal expansion coefficient (50-350° C.), $10^{-7}/$° C. | 34.2 | 36.6 | 35.5 | 36.3 | 34.8 | 37.1 | 37.4 | 36.2 |
| Young's modulus, GPa | 81.5 | 79.6 | 80.4 | 81.7 | 80.3 | 82.6 | 79.8 | 80.9 |
| Vickers hardness, Hv | 680.5 | 678.9 | 679.5 | 680.8 | 669.4 | 679.3 | 680.1 | 677.4 |
| Specific modulus, GPa/g × cm$^{-3}$ | 30.4 | 32.64 | 31.32 | 30.24 | 32.69 | 31.93 | 31.44 | 32.36 |
| Strain point, ° C. | 714 | 727 | 731 | 739 | 733 | 736 | 728 | 730 |
| Melting temperature, $T_{2.3}$ ° C. | 1628 | 1634 | 1648 | 1652 | 1643 | 1660 | 1639 | 1651 |
| Thermal shrinkage (600° C., 10 min), ppm | 9.97 | 10.63 | 9.03 | 11.31 | 9.66 | 10.23 | 11.02 | 10.76 |

TABLE 5

| Component wt % | Example 33 | Example 34 | Example 35 | Comparative example 1 | Comparative example 2 | Comparative example 3 | Comparative example 4 |
|---|---|---|---|---|---|---|---|
| $SiO_2$ | 71.23 | 71.66 | 71.90 | 59.03 | 73.84 | 66.42 | 66.5 |
| $Al_2O_3$ | 13.09 | 13.00 | 13.00 | 19.23 | 12.42 | 13.51 | 13.45 |
| $B_2O_3$ | 8.65 | 8.51 | 8.50 | 11.64 | 8.01 | 8.37 | 8.51 |
| MgO | 1.00 | 1.09 | 1.00 | 6.17 | 0.56 | 2.01 | 1.95 |
| CaO | 3.03 | 3.05 | 3.00 | 2.07 | 1.83 | 4.98 | 5.05 |
| SrO | 1.01 | 1.02 | 1.00 | 0.50 | 0.72 | 2.85 | 2.8 |
| $ZrO_2$ | 0.62 | 0.51 | 0.50 | 0.45 | 0.47 | | 1.59 |
| $P_2O_5$ | 1.24 | 1.06 | 1.00 | 0.76 | 2.00 | 1.71 | |
| $SnO_2$ | 0.13 | 0.10 | 0.10 | 0.15 | 0.15 | 0.15 | 0.15 |
| $SiO_2 + Al_2O_3$ | 84.32 | 84.66 | 84.90 | 78.26 | 86.26 | 79.93 | 79.95 |
| $(MgO + CaO + SrO)/Al_2O_3$ | 0.39 | 0.40 | 0.38 | 0.45 | 0.25 | 0.73 | 0.73 |
| Total amount of alkaline earth metals | 5.04 | 5.16 | 5.00 | 8.74 | 3.11 | 9.84 | 9.80 |
| $B_2O_3/(B_2O_3 + ZrO_2 + P_2O_5)$ | 0.82 | 0.84 | 0.85 | 0.91 | 0.76 | 0.83 | 0.84 |
| $(ZrO_2 + P_2O_5)/(MgO + CaO + SrO)$ | 0.37 | 0.30 | 0.30 | 0.14 | 0.79 | 0.17 | 0.16 |
| β-OH | 0.34 | 0.47 | 0.41 | 0.61 | 0.53 | 0.78 | 0.86 |
| Volatilization rate of boron, % | 10.31 | 9.86 | 10.11 | 14.8 | 13.5 | 12.76 | 12.31 |
| Thermal expansion coefficient (50-350° C.), $10^{-7}/$° C. | 35.9 | 37.3 | 38.1 | 38.1 | 36.5 | 36.3 | 35.8 |
| Young's modulus, GPa | 81.7 | 80.3 | 82.1 | 73.3 | 76.9 | 77.6 | 75.4 |
| Vickers hardness, Hv | 679.5 | 671.7 | 676.6 | 642.4 | 659.2 | 650.7 | 639.6 |
| Specific modulus, GPa/g × cm$^{-3}$ | 30.04 | 31.72 | 30.95 | 27.93 | 32.67 | 28.14 | 29.92 |
| Strain point, ° C. | 735 | 726 | 729 | 658 | 684 | 662 | 675 |
| Melting temperature, $T_{2.3}$ ° C. | 1649 | 1658 | 1662 | 1603 | 1672 | 1621 | 1618 |

TABLE 5-continued

| Component wt % | Example 33 | Example 34 | Example 35 | Comparative example 1 | Comparative example 2 | Comparative example 3 | Comparative example 4 |
|---|---|---|---|---|---|---|---|
| Thermal shrinkage (600° C., 10 min), ppm | 8.48 | 11.08 | 9.73 | 20.16 | 14.28 | 15.04 | 9.52 |

The above examples are only preferred examples of the present invention and are not intended to limit the present invention. Any modification, equivalent replacement, improvement, etc. made within the spirit and principle of the present invention should be included in the protection scope of the present invention.

The invention claimed is:

1. An alkali-free aluminoborosilicate glass, wherein raw materials of the alkali-free aluminoborosilicate glass consist of the following components expressed in terms of oxides in following weight percentages: 65.82-72% of $SiO_2$, 13.02-18% of $Al_2O_3$, 8.5-10% of $B_2O_3$, 1.15-4.5% of MgO, 3-8% of CaO, 1-5% of SrO, 0.5-2% of $ZrO_2$, 1-5% of $P_2O_5$, and 0.1-0.5% of $SnO_2$, and a total weight percentage of the raw materials is 100%;

wherein $SiO_2+Al_2O_3$ is 78.84-85%;

(MgO+CaO+SrO)/$Al_2O_3$ is 0.4-0.7;

a total amount of alkaline earth metal oxides is 5-11.5%;

$B_2O_3/(B_2O_3+ZrO_2+P_2O_5)$ is 0.6-0.9; and $(ZrO_2+P_2O_5)/(MgO+CaO+SrO)$ is 0.15-0.8.

2. The alkali-free aluminoborosilicate glass according to claim 1, wherein raw materials of the alkali-free aluminoborosilicate glass consist of the following components expressed in terms of oxides in following weight percentages: 65.82-70.5% of $SiO_2$, 13.02-17.5% of $Al_2O_3$, 8.5-10% of $B_2O_3$, 1.15-4.02% of MgO, 3.05-6.2% of CaO, 1.05-4.4% of SrO, 0.5-1.96% of $ZrO_2$, 1-4.93% of $P_2O_5$, and 0.1-0.5% of $SnO_2$;

wherein $SiO_2+Al_2O_3$ is 78.84-83.5%;

(MgO+CaO+SrO)/$Al_2O_3$ is 0.42-0.65;

a total amount of alkaline earth metal oxides is 5.45-10.3%;

$B_2O_3/(B_2O_3+ZrO_2+P_2O_5)$ is 0.62-0.83; and $(ZrO_2+P_2O_5)/(MgO+CaO+SrO)$ is 0.15-0.7.

3. The alkali-free aluminoborosilicate glass according to claim 1, wherein the glass has a β-OH value lower than 0.5%, a boron volatilization rate lower than 11%, a thermal expansion coefficient lower than $39.5 \times 10^{-7}$/° C. in the range of 50-350° C., a Young's modulus equal to or higher than 80.3 GPa, a strain point equal to or higher than 690° C., a melting temperature lower than 1662° C., and a thermal shrinkage rate lower than 11.5 ppm.

4. The alkali-free aluminoborosilicate glass according to claim 1, wherein the glass has 0.11-0.47% of a β-OH value, 5.67-10.37% of a boron volatilization rate, $33.70-39.5 \times 10^{-7}$/° C. of a thermal expansion coefficient in the range of 50-350° C., 80.3-84.1 GPa of a Young's modulus, 690-739° C. of a strain point, a melting temperature lower than 1662° C., and 7.68-11.45 ppm of a thermal shrinkage rate.

5. The alkali-free aluminoborosilicate glass according to claim 2, wherein the glass has a β-OH value lower than 0.5%, a boron volatilization rate lower than 11%, a thermal expansion coefficient lower than $39.5 \times 10^{-7}$/° C. in the range of 50-350° C., a Young's modulus equal to or higher than 80.3 GPa, a strain point equal to or higher than 690° C., a melting temperature lower than 1662° C., and a thermal shrinkage rate lower than 11.5 ppm.

6. The alkali-free aluminoborosilicate glass according to claim 2, wherein the glass has 0.11-0.47% of a β-OH value, 5.67-10.37% of a boron volatilization rate, $33.70-39.5 \times 10^{-7}$/° C. of a thermal expansion coefficient in the range of 50-350° C., 80.3-84.1 GPa of a Young's modulus, 690-739° C. of a strain point, a melting temperature lower than 1662° C., and 7.68-11.45 ppm of a thermal shrinkage rate.

* * * * *